United States Patent [19]

Ishac et al.

[11] Patent Number: 5,812,861
[45] Date of Patent: Sep. 22, 1998

[54] OVERRIDE SIGNAL FOR FORCING A POWERDOWN OF A FLASH MEMORY

[75] Inventors: Michel I. Ishac, Citrus Heights; Duane R. Mills, Folsom; Russell D. Eslick, Placerville, all of Calif.

[73] Assignee: Intel Corporation, Santa Clara, Calif.

[21] Appl. No.: 493,574

[22] Filed: Jun. 22, 1995

[51] Int. Cl.$^6$ .................................................... G06F 9/00
[52] U.S. Cl. ................... 395/750.06; 395/750; 395/700; 395/782.02; 364/200; 365/200
[58] Field of Search ...................... 395/750, 700, 395/182.02; 364/483, 200, 578, 707, 145, 227, 900

[56] References Cited

U.S. PATENT DOCUMENTS

| | | | |
|---|---|---|---|
| 4,335,445 | 6/1982 | Nercessian | 364/900 |
| 4,356,550 | 10/1982 | Katzman et al. | 364/200 |
| 4,387,449 | 6/1983 | Masuda | 365/227 |
| 4,523,295 | 6/1985 | Zato | 364/900 |
| 4,658,352 | 4/1987 | Nagasawa | 364/200 |
| 4,992,951 | 2/1991 | Glowczewski et al. | 364/483 |
| 5,185,869 | 2/1993 | Suzuki . | |
| 5,197,034 | 3/1993 | Fandrich et al. . | |
| 5,220,206 | 6/1993 | Tsang et al. | 307/296.3 |
| 5,222,046 | 6/1993 | Kreifels et al. . | |
| 5,224,070 | 6/1993 | Fandrich et al. . | |
| 5,247,657 | 9/1993 | Myers . | |
| 5,262,990 | 11/1993 | Mills et al. . | |
| 5,297,148 | 3/1994 | Harari et al. . | |
| 5,311,441 | 5/1994 | Tayama et al. | 364/483 |
| 5,388,265 | 2/1995 | Volk | 395/750 |
| 5,422,855 | 6/1995 | Eslick et al. . | |
| 5,428,579 | 6/1995 | Robinson et al. . | |
| 5,481,731 | 1/1996 | Conary et al. | 395/750 |
| 5,566,114 | 10/1996 | Pascucci et al. | 365/200 |
| 5,568,641 | 10/1996 | Nelson et al. | 395/700 |
| 5,630,146 | 5/1997 | Conary et al. | 395/750 |

FOREIGN PATENT DOCUMENTS

| | | |
|---|---|---|
| 0175458 | 3/1986 | European Pat. Off. . |
| 0392895 | 10/1990 | European Pat. Off. . |

OTHER PUBLICATIONS

R.D. Pashley and S.K. Lai, *Flash Memories: The Best of Two Worlds,* IEEE Spectrum, pp. 30–33 (Dec. 1989).

M.A. Levy and D. Elbert, *Solutions for High Density Applications Using Intel Flash Memory* (Oct. 1990), 1991 *Memory Products Handbook,* Intel Corporation, pp. 6–297 through 6–344.

S. Zales, *Flash Memory Outshines ROM and EPROM,* EETimes (May 1990), 1991 *Memory Handbook, Intel Corporation,* pp. 6–411 through 6–416 (1990).

R. Pashley, *Nonvolatility: Semiconductor vs. Magnetic,* IEEE, International Solid–State Circuits Conference (Feb. 28, 1988), *Memory Products Handbook,* Intel Corporation, pp. 6–393–394.

M. Levy, *Flash Memory Operates 10–20 Times Longer,* Computer Technology Review (Aug. 1990), 1991 *Memory Products Handbook,* Intel Corporation, pp. 6–417 and 6–418 (1990).

D. Lammers, *PC Standard in the Cards,* EETimes (May 1990), 1991 *Memory Products Handbook,* Intel Corporation, pp. 6–406 through 6–410 (1990).

(List continued on next page.)

*Primary Examiner*—Ayaz R. Sheikh
*Assistant Examiner*—Eric Thlang
*Attorney, Agent, or Firm*—Blakely, Sokoloff, Taylor & Zafman

[57] ABSTRACT

A powerdown controller receives a powerdown signal and causes a powerdown if the powerdown signal indicates a powerdown condition. An override signal also forces the powerdown controller to cause the powerdown when the powerdown signal is not indicating the powerdown condition. An override circuit generates the override signal if the powerdown condition is desired and the powerdown signal is not indicating the powerdown condition.

27 Claims, 4 Drawing Sheets

OTHER PUBLICATIONS

*Memory Breakthrough Drives Miniaturization,* Portable Computing (Oct. 1990) 1991 *Memory Products Handbook,* Intel Corporation, pp. 6–419 and 6–420 (1990).

S. Baker, Silicon Bits, *The Memory Driver,* 1991 *Memory Products Handbook,* Intel Corporation, pp. 6–399 (1990).

D. Verner, *Designing an Update BIOS Using Flasd Memory,* 1991 *Memory Products Handbook,* Intel Corporation, pp. 6–248 through 6–296 (Oct. 1990).

Data Sheets for the iMC004FLKA, 1991 *Memory Products Handbook,* Intel Corporation, pp. 6–143 throufh 6–202 (Oct. 1990).

C. Townsend, *Advanced MS–DOS Expert Techniques for Programmers,* pp. 1–63 (Howard W. Sams & Company 1989).

PC Card Standard Release 1.0 PCMCIA, *PC Card Standard,* pp. 1–102 Release 2.0, PCMCIA, *PC Card Standard,* pp. 1–1 through 6–38 & 1–4.

D.A. Patterson, J.L. Hennessy, and Goldberg, *Computer Architeture A Quantitative Approach,* Morgan Kaufmann Publishers, Inc., p. 519 (1990).

OVERRIDE SIGNAL FOR FORCING A POWERDOWN OF A FLASH MEMORY

FIELD OF THE INVENTION

The present invention relates generally to energy management within a system and specifically to controlling powerdown of components within the system.

BACKGROUND OF THE INVENTION

Power management within electronic systems is an important consideration. Both power consumption, and heat dissipation required as a result of power consumption, pose serious problems when designing a personal computer system. This is especially true in the case of mobile computers that typically are powered by batteries. The more power that the computer consumes, the less time that the computer can operate using a given sized battery. Therefore, as the operating speed of the computer is increased, a designer of a battery powered computer system is faced with several unattractive alternatives. If the same sized batteries are used, then the effective operating time for the computer system must decrease when the operating speed is increased. On the other hand, if the effective operating time is to remain constant (or, better yet, is to be increased) then it is necessary to either add additional batteries, thereby increasing the bulk and weight of the computer, or to use an exotic and therefore expensive battery technology (or both).

The trend in mobile computers is towards smaller, faster, less expensive and lighter units. Thus, the need to add additional batteries, or more expensive batteries is a significant disadvantage. This disadvantage is exacerbated by the need to add cooling fans, or to implement other cooling techniques, in order to dissipate the additional heat that is generated when the power is consumed.

One power management approach typically used is to provide a way to signal individual components within a system to enter an energy saving powerdown mode. This permits the system to identify idle components and force the idle components into the energy saving powerdown mode until they are needed. When a powered down component is needed, the idle component is then signaled to powerup into an active mode. The powered down component will then emerge from the powerdown mode and can be used.

One disadvantage associated with powerdown is that there is frequently a recovery period associated with powerup. During this recovery period, the component cannot be used. Thus, powerdown of idle components can degrade system performance if the system must stall each time a needed powered down component is powered back up.

To reduce system degradation caused by recovery, many components also have a standby mode, in addition to a powerdown mode. When placed in the standby mode, portions of the component that do not require a recovery period, or that only require an acceptably short recovery period, are powered down, but power is maintained to portions of the component that have an unacceptably long recovery period. Thus, the component can be placed in the standby mode to reduce power consumption over that of the active mode, without causing an unacceptable performance degradation that would be experienced if the maximum power saving benefit of powerdown mode were used.

It may be the case, however, that one desires to place a portion of a component into powerdown mode, independently from the mode of the rest of the component. This concept is best illustrated by example.

The 28F016SA flash memory device, manufactured by Intel Corporation, Santa Clara, Calif., is a high performance 16 Mbit (16,777,216 bit) block erasable non-volatile random access memory. The DD28F032SA 32-Mbit FlashFile™ flash memory, also manufactured by Intel Corporation, encapsulates two 28F016SA die in a single Dual Die Small Outline Package (DDSOP).

The DD28F032SA incorporates three chip enable input pins: CE0#, CE1# and CE2# to activate control logic, input buffers, decoders and sense amplifiers of the device. The active low combination of CE0# and CE1# controls the lower 28F016SA die. The active low combination of CE0# and CE2# controls the upper 28F016SA die. CE0# low enables chip operation while CE1# or CE2# select between the upper and lower die. CE1# and CE2# must not be active low simultaneously.

A powerdown mode of operation is invoked when a reset/powerdown (R/P#) pin input transitions low. All circuits that burn static power, even those circuits enabled in standby mode, are turned off. When returning from powerdown, a recovery time is required to allow these circuits to powerup. A CMOS standby mode of operation is enabled when either CE0# or both CE1# and CE2# transition high and R/P# stays high with all input control pins at CMOS levels. Thus, the three chip enable pins permit each die to be selectively placed in standby mode. Because there is only a single reset/powerdown pin, however, both dice must be powered down together. It impossible to selectively place each individual die into powerdown mode.

When manufacturing the DD28F032SA part, both 28F016SA dice are tested prior to encapsulating them in the DDSOP. Occasionally, however, one of the dice is found to be inoperative after encapsulation. In such a case, if the other die is operative, it is wasteful to simply scrap the part. One way to salvage the good die, would be to add a second R/P# pin, so there would be a separate R/P# pin for each die. This would permit each die to be powered down individually and the defective die could then be permanently powered down. Although straightforward, this approach requires the addition of a second R/P# pin. Therefore this approach may not be acceptable because pins are a scarce asset. Furthermore, this approach introduces a level of complexity for the system design by requiring separate control of each die within the part. This level of complexity is undesirable because several parts are typically controlled with a single powerdown signal line. If each part requires two powerdown signal lines, with some parts having one line tied to cause permanent powerdown of the lower die, other parts having the other line tied to cause permanent powerdown of the upper die, and yet other parts having no line tied, the design complexity for the system is great.

Another approach is to place the defective die into standby mode. This has the advantage that no extra pin is required. The part already has the ability to individually place each die into standby mode by using the three chip enable pins. Once again, however, one must add logic to keep each defective die in standby mode. Moreover, although power consumption in standby mode is less than that of active mode, it can be significantly higher than the amount of power consumed in powerdown mode. In the case of the DD28F032SA part, the typical current drawn in the standby mode is two milli-amps, but only two micro-amps are drawn in the powerdown mode.

SUMMARY OF THE INVENTION

A powerdown controller receives a powerdown signal and causes a powerdown if the powerdown signal indicates a powerdown condition. An override signal also forces the powerdown controller to cause the powerdown when the powerdown signal is not indicating the powerdown condition. An override circuit generates the override signal if the powerdown condition is desired and the powerdown signal is not indicating the powerdown condition.

Other features, objects, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
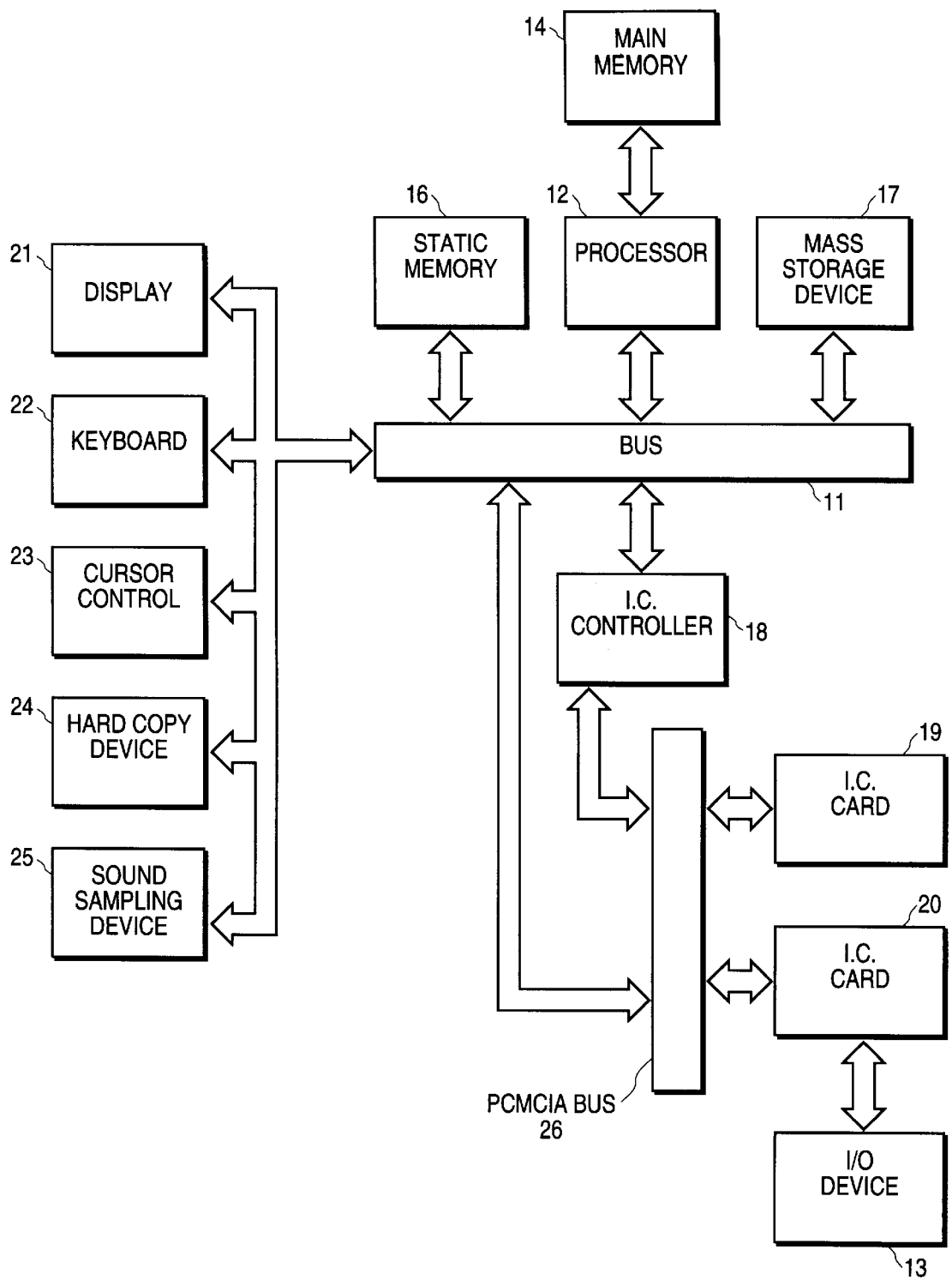
FIG. 1 is a block diagram of a computer system according to one embodiment wherein a portion of a component can be placed into powerdown mode independently from an external powerdown signal to the component.

FIG. 1 is a block diagram of a computer system according to one embodiment wherein a portion of a system component can be placed into powerdown mode independently from an external powerdown signal to the component. The computer system generally includes a bus 11, to which may be coupled a processor 12, main memory 14, static memory 16, mass storage device 17, and integrated circuit controller 18. Main memory 14 and static memory 16 may include a flash electrically erasable programmable read-only memory ("flash EEPROM") or other nonvolatile memory device. Similarly, mass storage device 17 may be a solid state hard drive 17 for storing data using nonvolatile memory devices.

Integrated circuit cards 19 and 20 may be included in the computer system and are coupled to a Personal Computer Memory Card Industry Association (PCMCIA) bus 26. PCMCIA bus 26 is coupled to bus 11 and to integrated circuit (IC) controller 18 for providing communication information between cards 19 and 20 and the remainder of the computer system. IC controller 18 provides control and address information to IC cards 19 and 20 via PCMCIA bus 26 and is coupled to bus 11. IC card 19 may be solid state hard drive or may be another type of memory device.

The computer system may further include a display device 21, a keyboard 22, a cursor control device 23, a hard copy device, and a sound sampling device 25. The specific components and configuration of the computer system is determined by the particular applications for which the computer system is to be used. For example, the computer system of FIG. 1 may be a personal digital assistant (PDA), a pen-based computer system, a mainframe computer, or a personal computer.

For the purpose of illustrating the present invention, the example begun previously of a dual die flash memory having a defective die will be continued in the detailed description. In the detailed description, an example will be presented of a dual die flash memory having a defective die wherein the defective dual die flash memory is a part of IC card 19, and wherein IC card 19 is a solid state hard drive.

It is to be understood, however, that this example is for illustrative purposes only, and that application of the present invention is not limited to IC card 19. For example, the present invention could alternately be used in conjunction with a flash memory that is part of main memory 14, static memory 15 or mass storage device 17.

Furthermore, it is to be understood that the present invention is not constrained to be applicable exclusively to a multiple die component. For one alternate embodiment, processor 12 can have a portion that can be placed into powerdown mode independently from the rest of the processor. For example, processor 12 can have both arithmetic logic unit (ALU) and floating point unit (FPU) portions (not shown) integrated onto a single die. The present invention could then be used to place the FPU into powerdown mode independently from the ALU in the event that the FPU is defective, or alternately, to reduce power consumption in the event that the FPU is not defective, but simply will not be needed for a foreseeable period of time.

Figure 2:
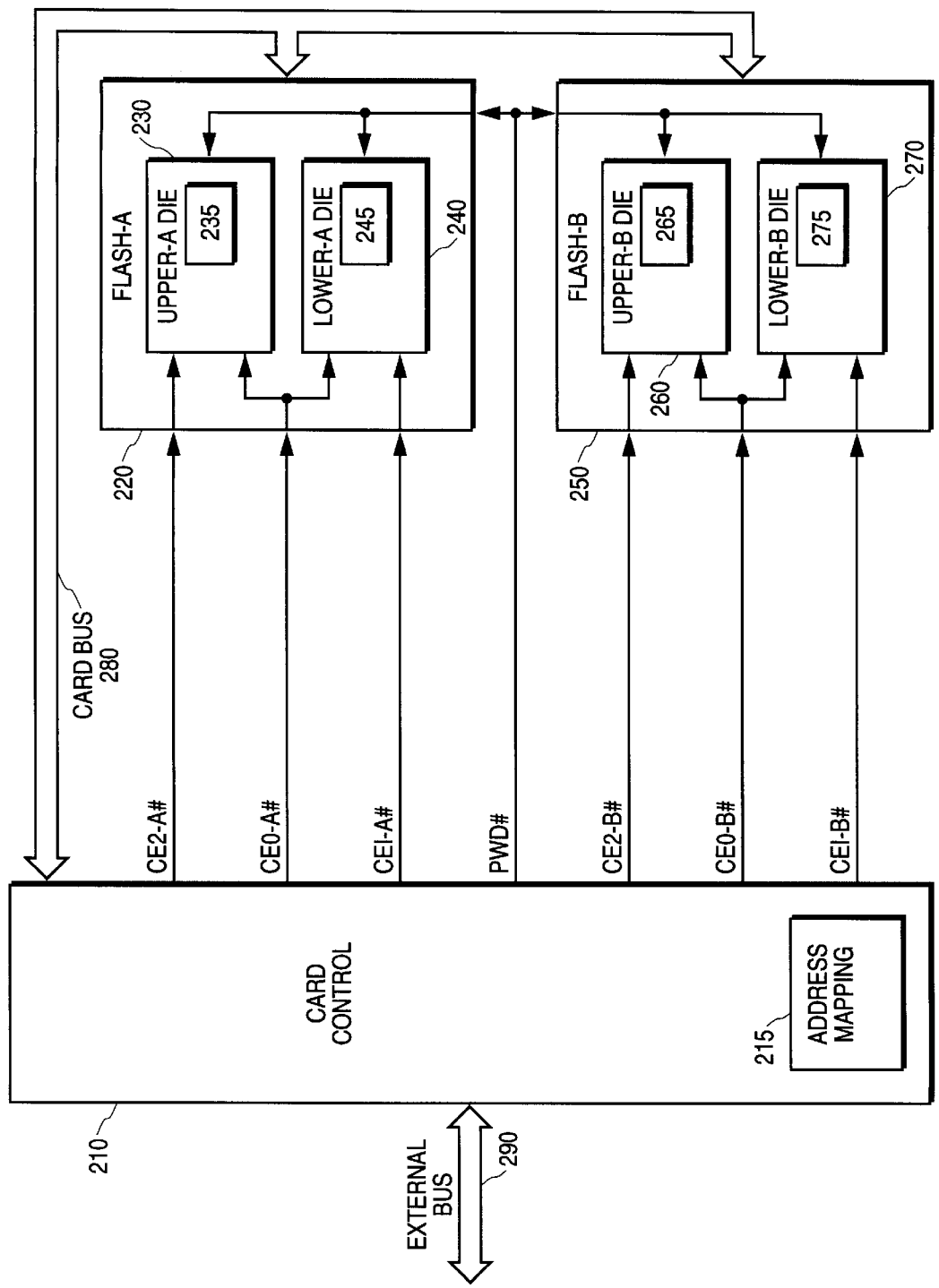
FIG. 2 illustrates a memory card from the computer system of FIG. 1 wherein a portion of one memory device can be placed into powerdown mode independently from an external powerdown signal to the memory device.

FIG. 2 is a diagram of a memory card such as IC card 19 of FIG. 1. The memory card 19 of FIG. 2 is a simplified version of a class of well known memory cards such as an IMC040FLSP 40 megabyte Series 2+Flash Memory Card, manufactured by Intel Corporation. Descriptions of generic versions of this class of memory card can be found, for example, in U.S. Pat. Nos. 5,379,401, issued Jan. 3, 1995, and 5,388,248, issued Feb. 7, 1995. FIG. 2 has been simplified by reducing the number of flash memory integrated circuits within the card and by eliminating from the drawing extraneous signals. These extraneous signals are extraneous in the sense that, although they are required for the proper operation of the card, they are not required to appreciate the operation of the present invention.

The operation of IC card 19 can be described briefly. Address, data and commands enter IC card 19 over external bus 290 and are received by card control 210. Card control 210 uses information stored in address mapping 215 to selectively control flash-A 220 and flash-B 250, and thereby, to selectively route access requests received over external bus 290 to flash-A 220 or flash-B 250. Thus, for example, card control 210 may receive from external bus 290 a control signal indicating that a write operation is requested, along with data and an address identifying a memory location to which the data is to be written.

Upon receiving the write request, if flash-A 220 and flash-B 250 are powered down, card control 210 will use signal PWD# to signal flash-A 220 and flash-B 250 that they are to leave the powerdown mode in preparation for the write operation to be performed. Based upon the address received on the external bus 290, card control 210 will then use address mapping 210 to determine whether flash-A 220 or flash-B 250 contains the memory location to which the data is to be written.

Assuming that flash-A 220 has the memory location to which the data is to be written, card control 210 will use chip enable signal CE0-A# to enable flash-A 220 and will use chip enable signal CE0-B# to disable flash-B 250. Also based upon the address received on the external bus 290, card control 210 will use address mapping 210 to determine whether upper-A die 230 or lower-A die 240 of flash A 220 contains the memory location to which the data is to be written. Assuming that upper-A die 230 of flash-A 220 has the memory location to which the data is to be written, card control 210 will use chip enable signal CE2-A# to enable upper-A die 230 and will use chip enable signal CE1-A# to disable lower-A die 240. After upper-A die 230 has been enabled, card control 210 can then send the proper address, data and control signals across card bus 280 to upper-A die 230 of flash-A 220, and thereby, write the data to the proper memory location within IC card 19.

Dual die flash-A memory 220 has an ability to selectively powerdown upper-A die 230 or lower-A die 240 independently from the powerdown signal PWD#. Similarly, dual die flash-B memory 250 has an ability to selectively powerdown upper-B die 260 or lower-B die 270 independently from the powerdown signal PWD#. Thus, circuitry 235, 245, 265 and 275 can be used to powerdown upper-A die 230, lower-A die 240, upper-B die 260 and lower-B die 270, respectively, independently from powerdown signal PWD#, in the event that the associated die is defective.

In the event that there is one (or more) defective die, software can be used to set the address mapping 215 of the card controller 210 to map the independently powered down defective die (or dice) out of the address space of the IC card 19. Thus, although the memory storage capacity of the IC card 19 will be decreased by the amount of memory storage capacity of the defective die (or dice), there will be no need to otherwise modify IC card 19. For example, there will be no need to tie one of the chip enable signal lines to thereby place a defective die into permanent standby mode. Thus, there will be no resulting current drain associated with placing the defective die into the standby mode, and there will be no need to modify the circuitry of the memory card to cause the chip enable signal to be tied. Moreover, powerdown of the non-defective portions of flash-A 220 and flash-B 250 memories can be controlled by the card control 210 using a single powerdown signal PWD# common to both flash memories. This powerdown control will be effected independently from the permanent powerdown of the defective die. Thus, there is no need to provide separate powerdown signals for each die of each flash memory. Therefore, no extra pins need be added to the flash memories, and the attendant complexity associated with having multiple powerdown signals is avoided.

Assuming that upper-A die 230 of flash-A 220 is defective, circuitry 235 can be used to place upper-A die 230 into permanent powerdown mode independently from powerdown signal PWD#. In such a case, address mapping 215 can be used to remove an address space associated with defective upper-A die 230 from the address mapping for IC card 19. Thus, an attempt to access a memory location associated with defective upper-A die 230 would result in card control 210 placing onto external bus 290 an error signal indicating an error occurred because of an attempted access to an invalid address.

Alternately, address mapping 215 can be used to remap an address space associated with defective upper-A die 230 to another die that is not defective, thereby preserving a contiguous address mapping for IC card 19. This could be achieved by remapping defective upper-A die 230 to a spare flash memory (not shown) that was provided to supplement the defective flash memory and thereby maintain the entire address space of a fully functional IC card 19.

Alternately, defective upper-A die 230 could be remapped to a non-defective die such as lower-A die 240 or upper-B die 260 to provide a contiguous address space. Assuming that defective upper-A die 230 has been remapped to non-defective upper-B die 260, if a write operation is specified to a memory location normally associated with upper-A die 230, address mapping 215 would instead indicate that the address corresponds to a memory location of upper-B die 260. Powerdown signal PWD# would then be used to powerup flash-B 250, and chip enable signals CE0-B# and CE2-B# would be used to select upper-B die 260 in place of defective upper-A die 230.

Note that although a symmetric system is presented in FIG. 2 wherein both dice of both flash memories can be powered down independently from signal PWD#, this, however, need not be the case. Thus, for example, it could alternately be the case that not every die of a multiple die flash memory has the ability to be placed into powerdown mode independently from the powerdown signal.

Similarly, it could alternately be the case that not every flash memory of a multiple flash memory card has the ability to selectively place individual dice into powerdown mode independently from the powerdown signal.

Figure 3:
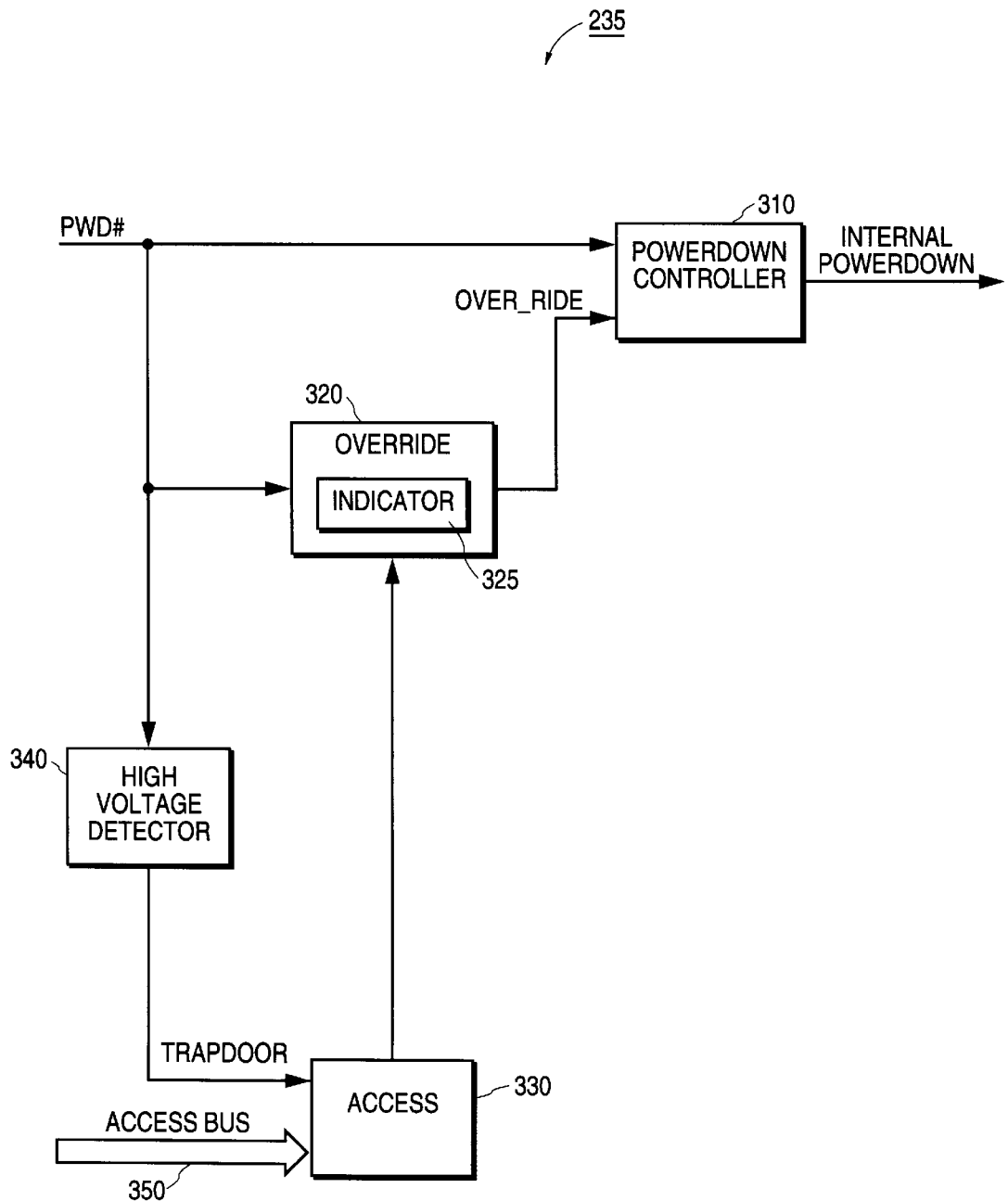
FIG. 3 illustrates circuitry to place a portion of a component into powerdown mode independently from an external powerdown signal.

FIG. 3 is a block diagram of one embodiment of powerdown circuitry such as that of circuitry 235 of upper-A die 230 of memory flash-A 220 in FIG. 2. In FIG. 3 it can be seen that external powerdown signal PWD# is provided to powerdown controller 310. If external signal PWD# indicates that a powerdown condition exists, powerdown controller 310 will usually use INTERNAL POWERDOWN signal line to indicate to the components of the die that they are to be powered down. Similarly, if signal PWD# indicates that an external powerup condition exists, powerdown controller 310 will usually use the INTERNAL POWERDOWN signal line so indicate to the components of the die that are to be powered up.

Indicator 325 of override circuitry 320, however, can be set to indicate that the die is to be placed into powerdown mode independently from the value of external powerdown signal PWD#. If indicator 325 is so set, signal OVER-RIDE from override circuitry 320 will cause powerdown controller 310 to ignore any powerup command from external powerdown signal PWD#. Thus, powerdown controller 310 will cause the INTERNAL POWERDOWN signal to indicate a powerdown condition to components of the die that are to be powered down, even though external powerdown signal PWD# is indicating that these components are to be powered up.

In the event that indicator 325 of override circuitry 320 has not been set to indicate that the die is to be placed into powerdown mode independently from the value of external powerdown signal PWD#, then signal OVER-RIDE will not cause powerdown controller 310 to ignore a powerup command from external powerdown signal PWD#.

For the embodiment shown in FIG. 3, external powerdown signal PWD# is also presented to override circuitry 320 to cause override circuitry 320 to be placed into the powerdown mode during an externally forced powerdown. Regardless of the override condition value stored in indicator 325, when override circuitry 320 is placed into the powerdown mode, signal OVER-RIDE will indicate to powerdown controller 310 that it is not to ignore powerdown signal PWD#.

Thus, when powerdown signal PWD# indicates that the die is to enter the powerdown mode, override circuitry 320 will also powerdown to further reduce power consumption. Later, when external powerdown signal PWD# indicates that the die is to powerup, override circuitry 320 will powerup. If, however, indicator 325 has been set to indicate an override condition, signal OVER-RIDE from override circuitry 320 will then cause powerdown controller 310 to ignore the powerup command from external powerdown signal PWD#.

Access bus 350 is used to send address, data and control signals to access circuitry 330, and thereby to set indicator 325 of override circuitry 320. For the embodiment shown in FIG. 3, a high voltage signal (i.e., a voltage beyond the normal operating voltage of signal PWD#) is used to open a trap door and permit access circuitry 330 to set or clear indicator 325 of override circuitry 320. Access circuitry 330 is normally used to access components within the die other than indicator 325 (e.g., individual flash cells). High voltage detector 340 detects when a high voltage signal is placed upon powerdown signal line PWD#, and uses signal TRAP-DOOR to indicate to access circuitry 330 that address, data and control information from access bus 350 is to be used to set or clear indicator 325 of override circuitry 320.

For one embodiment, indicator 325 is a non-volatile storage cell that will retain any value stored therein when power has been removed from the die. Thus, if the die is found to be defective at the factory, indicator 325 can be set to place the die into permanent powerdown mode. Because the setting in indicator 325 will be retained, a part having the disabled defective die can then be used in a system that does not have the ability to open the trap door to set or clear indicator 325. The trap door also permits one to clear the indicator 235 in the event that a non-defective die has been accidentally disabled.

Figure 4:
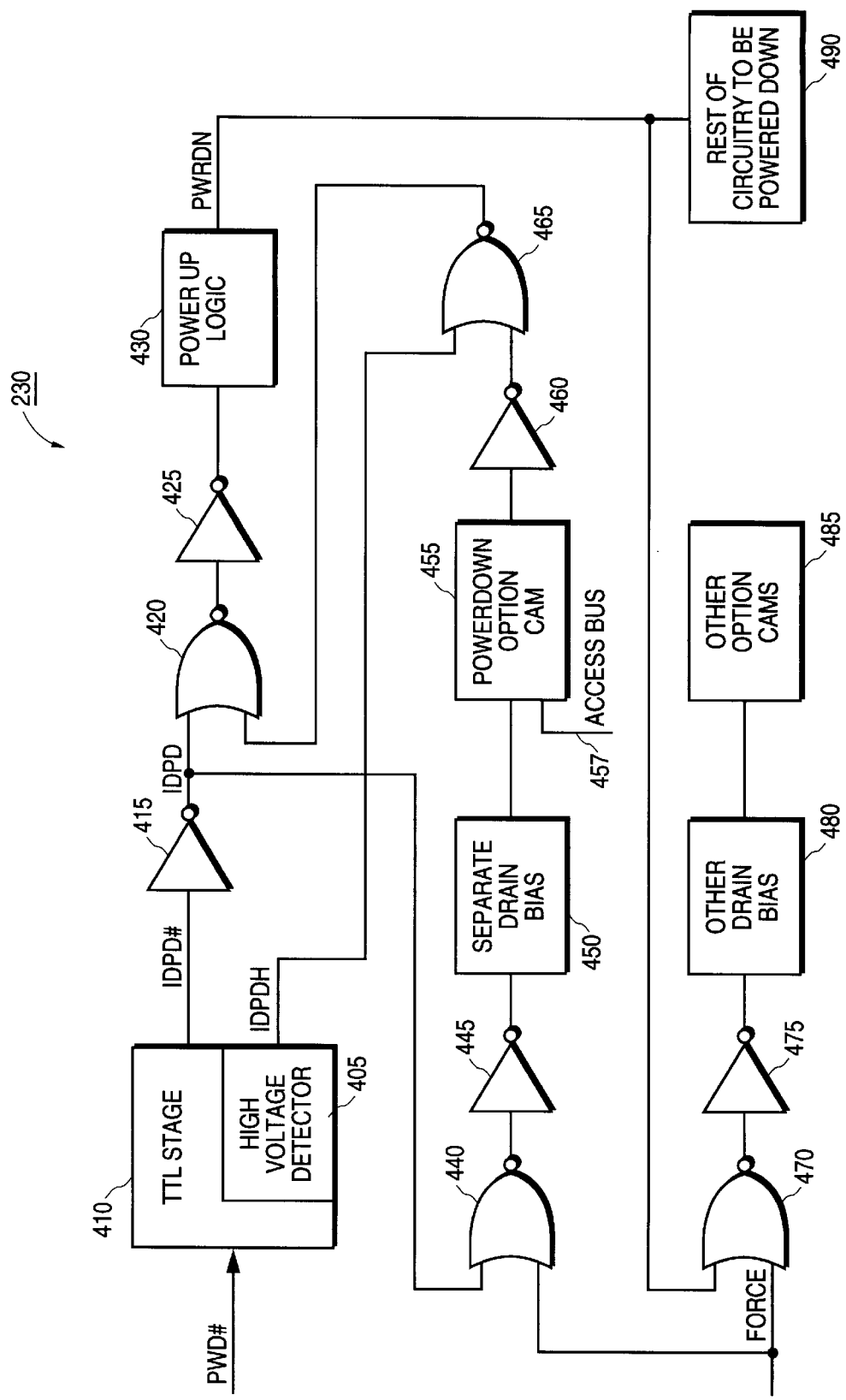
FIG. 4 illustrates a component that can be placed into powerdown mode independently from an external powerdown signal.

FIG. 4 illustrates an embodiment of upper-A die 230 of FIG. 2 wherein a powerdown option content addressable memory (CAM) provides the function of indicator 325 of FIG. 3. Content addressable memory is a nonvolatile form of memory that is frequently used in flash memory integrated circuitry. Thus, in addition to powerdown option CAM 455, die 230 has other option CAMs 485. For example, certain other option CAMs 485 can be used to store row or column redundancy information that is used to control replacement of defective rows or columns in the flash array using redundant rows or columns. A description of the use of CAMs to provide redundancy information can be found in U.S. Pat. No. 5,031,142, issued Jul. 9, 1991, and also can be found in U.S. Pat. No. 5,046,046, issued Sep. 3, 1991.

A content addressable memory cell has an associated drain bias circuitry. Although a content addressable memory cell is non-volatile, the value stored within the cell cannot be read unless the drain bias circuitry for the cell is enabled. Powerdown option CAM 455 has an associated separate drain bias circuitry 450. Bias circuitry 450 is separate in the sense that power to drain bias circuitry 450 is controlled separately from power to other drain bias circuitry 480 (associated with other option CAMs 485). For the embodiment shown in FIG. 4, regardless of the value stored in powerdown option CAM 455, the default value of power-down option CAM 455 output to inverter 460 will be logical zero when separate drain bias circuitry 450 is not enabled.

Whether or not separate drain bias circuitry 450 is enabled is controlled by the signal output from inverter 445. When the signal output from inverter 445 is high, drain bias circuitry 450 is disabled and the output from powerdown option CAM 455 will default to logical zero. Conversely, when the signal output from inverter 445 is low, drain bias circuitry 450 is enabled and the output from powerdown option CAM 455 will be the value stored in powerdown option CAM 455.

Similarly, whether or not other drain bias circuitry 480 is enabled is controlled by the signal output from inverter 475. When the signal output from inverter 475 is high, other drain bias circuitry 480 is disabled and each output from other option CAMs 485 will default to logical zero. Conversely, when the signal output from inverter 475 is low, other drain bias circuitry 480 is enabled and the outputs from other option CAMs 485 will be the respective values stored in CAMs 485.

Signal FORCE is a signal internal to die 230 that can be used to force powerdown option CAM 455 and other option CAMs 485 to output their default value of zero. For one embodiment, signal FORCE can only be asserted when the trap door has been opened. Alternately, signal FORCE can be asserted anytime it is desired to force powerdown option CAM 455 and other option CAMs 485 to output their default value of zero.

Signal FORCE is provided as an input to NOR gate 440 and is also provided as an input to NOR gate 470. The signal output from NOR 440 is inverted by inverter 445. The signal output from inverter 445, in turn, controls powerup of separate drain bias circuitry 450. Because the output of NOR 440 is inverted by inverter 445, separate drain bias circuitry 450 will be powered down when the signal output from NOR 440 is low and will be powered up when the signal output from NOR 440 is high.

It is the property of any two input NOR gate that the output will be logical one (i.e., high) only when both inputs are logical zero (i.e., low). If either input is high, or if both inputs are high, then the output from the NOR gate will be low. Thus, when signal FORCE is high, it will force the output from the powerdown option CAM 455 to have the default value of zero. This is because when FORCE is high, NOR 440 will output a low signal to inverter 445 regardless of the value of the other signal (IDPD) input to NOR 440. Because the low output of NOR 440 is inverted by inverter 445, separate drain bias circuitry 450 will have a high signal input from inverter 445, and therefore, will powerdown. Thus, because the separate drain bias circuitry 450 for powerdown option CAM 455 is powered down, the output from the powerdown option CAM 455 will be the default value of zero.

Similarly, when signal FORCE is high, it will also force each output from the other option CAMs 485 to have the default value of zero. This is because when FORCE is high, NOR 470 will output a low signal to inverter 475 regardless of the value of the other signal (PWRDN) input to NOR 470. Because the low output of NOR 470 is inverted by inverter 475, other drain bias circuitry 480 will have a high signal input from inverter 475, and therefore, will powerdown. Thus, because the other drain bias circuitry 480 for other option CAMs 485 is powered down, each output from the other option CAMs 485 will be the default value of zero.

Therefore, it can be seen that signal FORCE is a signal that can be used to force powerdown option CAM 455, and other option CAMs 485, into a known output state (i.e., default output of zero). This capability is useful to establish a reference state for die 230 during testing. During normal operation of die 230, however, signal FORCE always has a low value. It is the property of a two input NOR gate that when a first input is held to logical zero (i.e., held low), the NOR gate will function as an inverter of the second input. Thus, when the first input to a two input NOR gate is held low, the output of the NOR gate will be high when the second input is low, and will be low when the second input is high.

Returning to NOR 470, this means that when signal FORCE is held low (i.e., normally) and signal PWRDN is high, then other drain bias circuitry 480 will powerdown and other option CAMs 485 will each output the default value of zero. This also means that when signal FORCE is held low (i.e., normally) and signal PWRDN is low, then other drain bias circuitry 480 will powerup and other option CAMs 485 will each output the respective value stored within the respective CAM cell. Thus, it can be seen that during the normal case when FORCE is held low, powerdown of other drain bias circuitry 480 is controlled by signal PWRDN. When signal PWRDN is low, then other drain bias circuitry 480 will powerup. But, when signal PWRDN is high, then other drain bias circuitry 480 will powerdown.

Signal PWRDN also controls the rest of the circuitry 490 (of die 230) that is to be powered down when die 230 is placed into powerdown mode. As described earlier, the rest of the circuitry 490 that is to be powered down includes all of the circuitry that burns static power, including the circuitry that is enabled in standby mode. As discussed earlier, signal PWRDN controls powerdown of other drain bias circuitry 480 except when signal FORCE is high. As will be discussed below in greater detail, signal PWRDN does not control powerdown for the separate drain bias circuitry 450 of the powerdown option CAM 455.

Signal PWRDN is generated by powerup logic 430 in response to the signal output from inverter 425. When the signal output from inverter 425 is low, powerup logic 430 will cause signal PWRDN to be low, thereby causing circuitry 490 to powerup and, unless FORCE is high, also cause circuitry 480 to powerup. Conversely, when the signal output from inverter 425 is high, powerup logic 430 will cause signal PWRDN to be high, thereby causing circuitry 490 to powerdown and also cause circuitry 480 to powerdown (unless FORCE is high, in which case circuitry 480 will already be powered down).

The signal output from inverter 425 is an inverted version of the signal output from NOR gate 420. One input to NOR gate 420 is signal IDPD. It can be seen from the figure that signal IDPD is an inverted CMOS version of external powerdown signal PWD#. Signal PWD# (i.e., signal R/P#) is converted by TTL (transistor-to-transistor logic) stage 410 into signal IDPD#. Thus, IDPD# is a CMOS version of PWD#. Signal IDPD#, in turn, is inverted by inverter 415 to produce signal IDPD. Therefore, when signal PWD# transitions low to signal an external powerdown command, signal IDPD will transition high (i.e., to logical one). Regardless of the value of the other input signal for NOR 420, because signal IDPD is high, the output from NOR 420 to inverter 425 will be low, and therefore, powerup logic 430 will signal a powerdown over signal line PWRDN.

It is a more complicated matter to make NOR 420 have a high output to inverter 425, and thereby, to cause powerup logic 430 to signal a powerup over signal line PWRDN. This is because when external powerdown signal PWD# transitions high to signal an external powerup command, signal IDPD will transition low (i.e., to logical zero). If IDPD is low, the output of NOR 420 will depend upon the value of the signal output from NOR 465 to the other input of NOR 420. Thus, if IDPD is low (indicating an external powerup command), NOR 420 will act as an inverter for the other input to NOR 420 (i.e., the signal output from NOR 465). Therefore, when IDPD is low and the output from NOR 465 is low, the output from NOR 420 to inverter 425 will be high, and powerup logic 430 will signal a powerup over signal line PWRDN. If, however, the output from NOR 465 is high when IDPD is low, the output from NOR 420 to inverter 425 will be low, and powerup logic 430 will signal a powerdown over signal line PWRDN.

As shown earlier, when IDPD is high (corresponding to an external powerdown command), the value of the signal output from NOR 465 has no effect upon the output of NOR 420, and therefore powerup logic 430 will signal a powerdown over signal line PWRDN. Note that when IDPD is high, separate drain bias 450 will not be enabled. This will cause powerdown option CAM 455 to have the default value of zero and the output from NOR 465 will be low. Thus, signal IPDP drives the powerup logic 430 when signal IDPD is high.

Signal IDPDH is a trap door signal and will only be high when the trapdoor is open. Thus, when high voltage detector 405 detects a voltage higher than the normal operating voltage of signal PWD#, signal IDPDH will be high and the trap door will be opened. So long as the trap door is closed (i.e., signal PWD# has a voltage that ranges inclusively between ground and its normal operating voltage), signal IDPDH will not be high. Thus, when the trap door is closed (i.e., IDPDH is low) and the output of inverter 460 is low. (indicating a powerdown override condition), the value of the signal output from NOR 465 will be high. In such a case, the value of IDPD has no effect upon the output of NOR 420, and therefore powerup logic 430 will signal a powerdown over signal line PWRDN. Thus, the powerdown signal will be overridden and a powerdown condition will result.

If, however, the trap door is open (i.e., IDPDH is high), the output from NOR 465 will be low regardless of the value of the signal output from inverter 460. In such a case, IDPD will be low because PWD# is being used to open the trap door, rather than to signal a powerdown or powerup command. Thus, the signal output from NOR 420 will be high and powerup logic 430 will signal a powerup over signal line PWRDN. Therefore, when the trap door is open, an indication of a powerdown override condition stored in powerdown option CAM 455 will itself be overridden and a powerup result. Thus, if powerdown option CAM 455 has been erroneously set to indicate a powerdown override condition, the trap door can be opened and steps can be taken to change the state of the powerdown option CAM 455. In such a case, the IDPDH signal will be high because the trap door is open and this will cause an override of the powerdown option CAM 455. Then, the signal FORCE can be used to disable separate drain bias circuitry 450 and access bus 457 can be used to program the powerdown option CAM 455.

Furthermore, as stated before, unless separate drain bias circuitry 450 is enabled, powerdown option CAM 455 will have a default output of zero. Therefore, simply storing a one value in powerdown option CAM 455 is not sufficient to override an external powerup command and thereby to cause a powerdown of circuitry 480 and 490. In addition to storing a one value in powerdown option CAM 455, one must also powerup separate bias circuitry 450 to ensure that an external powerup command is overridden.

Powerup of separate drain bias circuitry 450 is controlled by the signal output from inverter 445. When the signal output from inverter 445 is low, separate drain bias circuitry 450 will be enabled. This will only happen when signals FORCE and IDPD input to NOR 440 are both low. Signal FORCE is normally low, however. Furthermore, when signal PWD# indicates an external powerup command, signal IDPD will be low. Therefore, separate drain bias circuitry 450 will be enabled whenever an external powerup is signaled, except in the extraordinary case where signal FORCE is used to force circuitry 450 to powerdown. Because separate drain bias circuitry 450 is enabled, a one value stored in powerdown option CAM 455 will be output from CAM 455 and cause powerup logic 430 to signal circuits 480 and 490 to powerdown even though an external powerup command is being indicated by signal PWD#.

On the other hand, if separate drain bias circuitry 450 is enabled but a zero value is stored in powerdown option CAM 455 and an external powerup command is being indicated by signal PWD#, the stored zero value will be output from CAM 455 and cause powerup logic 430 to signal circuits 480 and 490 to powerup. Thus, storing a zero in powerdown option CAM 455 will prevent an override of an external powerup command.

Furthermore, when signal FORCE is one, separate drain bias circuitry 450 will powerdown and powerdown option CAM 455 will output the default output value of zero, regardless of the value stored in CAM 455. Thus, signal FORCE can be used to disable the override of an external powerup command provided by powerdown option CAM 455.

Moreover, separate drain bias circuitry 450 will always powerdown whenever there is an external powerdown command indicated by signal PWD#. This is because signal IDPD will be one, forcing the output of NOR 440 to be zero, and thereby forcing the input to separate drain bias 450 (output from inverter 445) to be one.

Therefore, the circuit of FIG. 4 has the property that an external powerdown command will cause circuitry 450, 480 and 490 to be powered down. An external powerup command will cause separate drain bias circuitry 450 to powerup so that a value stored in powerdown option CAM 455 can be output from CAM 455. If a zero value is stored in powerdown option CAM 455 (indicating no override of a powerup), then the external powerup command will not be overridden and circuitry 480 and 490 will be powered up. If, however, a one value is stored in powerdown option CAM 455 (indicating an override of a powerup), then the external powerup command will be overridden and circuitry 480 and 490 will remain powered down. Furthermore, signal FORCE can be used to disable CAM 455 and CAMs 485 and force each CAM to output a default value of zero. Moreover, a trap door can be opened thereby permitting an erroneously set powerdown condition stored in powerdown option CAM 455 to be reset.

Note that many alterations can be made to the circuitry of FIG. 4 without changing operation of the circuit. For example, a NOR gate and inverter pair, arranged such that the output of the NOR gate is input to the inverter, is logically equivalent to an OR gate. Thus, the NOR 420 and inverter 425 pair could be replaced by an OR gate. Similarly, the NOR 440 and inverter 445 pair (or the NOR 470 and inverter 475 pair) could also be replaced by an OR gate.

It is also possible to remove the signal FORCE from the circuit of FIG. 4, if an ability to force default values is not required. The signal FORCE has been used herein to disable the separate drain bias circuitry 450 and thereby to allow one to change the state of the powerdown option CAM 455. In the case wherein the signal FORCE has been removed, the ability to change the state of the powerdown option CAM 455 if the powerdown option has been erroneously set will be lost. If the signal FORCE is removed from the circuit of FIG. 4, NOR gates 440 and 470 can be replaced by inverters. Alternately, NOR gates 440 and 470 and inverters 445 and 475 could be removed. In the latter case, separate drain bias circuitry 450 could be controlled directly by signal IDPD and other drain bias circuitry 480 could be controlled directly by signal PWRDN.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An apparatus comprising:
    a die having a first component and a second component;
    a controller for placing the first component and the second component in a powerdown state by asserting a powerdown signal and for placing the first component and the second component in a powerup state by asserting a powerup signal; and
    circuitry coupled to the controller to indicate to the controller to keep the first component in the powerdown state even when the second component is in the powerup state, the circuitry further including an indicator indicating to the controller that the first component is to remain in the powerdown state, even when the powerup signal is asserted.

2. The apparatus of claim 1, further comprising:
    the circuitry further for overriding an attempt of the controller to place the first component in the powerup state when the controller attempts to place both the first component and the second component in the powerup state.

3. The apparatus of claim 1, wherein the indicator is an override content addressable memory for storing a powerdown desired condition.

4. The apparatus of claim 3, wherein the indicator is a non-volatile storage cell that retains a value stored therein when a power has been removed from the die.

5. The apparatus of claim 1, wherein the powerdown signal powers down the circuitry.

6. The apparatus of claim 1, further comprising:
    an access circuitry to control the circuitry.

7. The apparatus of claim 6, wherein said access circuitry utilizes a trap door to access the circuitry.

8. The apparatus of claim 7, herein said trap door is a high voltage signal.

9. The apparatus of claim 1, wherein said first component and the second component on the die comprise a flash memory device.

10. The apparatus of claim 9, wherein the first component is a single flash memory device in a multiple flash memory device unit.

11. The apparatus of claim 1, wherein said first component comprises a floating point unit (FPU) and said second component comprises an arithmetic logic unit (ALU).

12. The apparatus of claim 1, wherein said first component is a defective component, wherein a non-defective components on the die may be utilized while the defective component remains in the powerdown state.

13. An apparatus for placing a designated component of a plurality of components on a die into a powerdown mode, the apparatus comprising:
    a controller for placing the plurality of components into the powerdown mode by asserting a powerdown signal and further for placing the plurality of components into a powerup mode by asserting a powerup signal;
    circuitry for forcing the controller to powerdown a first component when the powerdown signal is not indicating the powerdown state and for maintaining the first component in the powerdown state when the controller indicates a powerup state, the circuitry comprising an override content addressable memory (CAM) for storing a desired condition, wherein the CAM is a nonvolatile storage cell that retains a value stored therein when a power has been removed from the die; and wherein said first component is a defective component wherein a non-defective components on the die may be utilized while the defective component remains in the powerdown state.

14. A method comprising the steps of:

powering down a first component and a second component on a die in a powerdown state if a powerdown signal indicates the powerdown state;

generating an override signal to place the first component into a powerdown state when the powerdown signal is not indicating the powerdown state;

powering up the first component and the second component when a powerup signal indicates a powerup state;

determining if a circuitry indicates that the first component is to remain in the powerdown state; and maintaining the first component in the powerdown state if the circuitry indicates that the first component is to remain in the powerdown state.

15. The method of claim 14, wherein said step of determining if the circuitry indicates that the first component is to remain in the powerdown state further comprises:

examining an indicator, the indicator indicating that the first component is to remain in the powerdown state.

16. The method of claim 15 wherein said indicator is an override content addressable memory.

17. The method of claim 16 further comprising storing an indicator value in the indicator, wherein the indicator is a non-volatile storage cell that retains the indicator value stored therein when a power has been removed from the die.

18. The method of claim 14, further comprising powering down the circuitry in response to the powerdown signal.

19. The method of claim 14, further comprising the step of controlling the circuitry using an access circuit.

20. The method of claim 19, wherein the step of controlling comprises using a trap door to access and control the circuitry.

21. The method of claim 20 wherein the trap door is a high voltage signal.

22. The method of claim 14, further comprising the step of applying a high voltage signal to the circuitry to control the circuitry.

23. The method of claim 14, wherein said first component and said second component comprise a flash memory device.

24. The method of claim 23, wherein the first component is a single flash memory device in a multiple flash memory device unit.

25. The method of claim 14, wherein said first component is a floating point unit (FLU) and said second component comprises an arithmetic logic unit (ALU).

26. The method of claim 14, wherein said first component is a defective component, wherein non-defective components on the die may be utilized while the defective component remains in the powerdown state.

27. A method comprising the steps of:

powering down a plurality of components if a powerdown signal indicates a powerdown state;

generating an override signal to place a first component of the plurality of components in the powerdown state when the powerdown signal is not indicating the powerdown state;

powering up the plurality of components when a powerup signal indicates a powerup state;

determining if an indicator indicates that the first component is to remain in the powerdown state by examining an indicator; and maintaining the first component in the powerdown state if the indicator indicates that the first component is to remain in the powerdown state;

wherein said first component is a defective component, wherein non-defective components on the die may be utilized while the defective component remains in the powerdown state.

* * * * *